(12) United States Patent
McQuilkin (10) Patent No.: US 11,264,906 B2
(45) Date of Patent: Mar. 1, 2022

(54) COMPOUND PIN DRIVER CONTROLLER

(71) Applicant: Analog Devices, Inc., Norwood, MA (US)

(72) Inventor: Christopher C. McQuilkin, Hollis, NH (US)

(73) Assignee: Analog Devices, Inc., Norwood, MA (US)

( * ) Notice: Subject to any disclaimer, the term of this patent is extended or adjusted under 35 U.S.C. 154(b) by 278 days.

(21) Appl. No.: 16/713,454

(22) Filed: Dec. 13, 2019

(65) Prior Publication Data

US 2021/0184579 A1    Jun. 17, 2021

(51) Int. Cl.
*G01R 31/327* (2006.01)
*H02M 3/158* (2006.01)
*G01R 31/319* (2006.01)

(52) U.S. Cl.
CPC .... *H02M 3/1584* (2013.01); *G01R 31/31926* (2013.01); *G01R 31/327* (2013.01)

(58) Field of Classification Search
CPC ........... H02M 3/1584; G01R 31/31926; G01R 31/327
See application file for complete search history.

(56) References Cited

U.S. PATENT DOCUMENTS

| 5,270,660 A | 12/1993 | Werner, Jr. et al. |
| 5,493,519 A | 2/1996 | Allen, III |
| 5,942,922 A | 8/1999 | Dinteman et al. |
| 6,292,010 B1 | 9/2001 | Persons et al. |
| 6,294,949 B1 | 9/2001 | Kojima et al. |
| 6,377,051 B1 | 4/2002 | Tyner et al. |
| 6,535,049 B2 * | 3/2003 | Jaynes ........... G01R 31/318558 324/76.82 |

(Continued)

FOREIGN PATENT DOCUMENTS

| CN | 112731120 | 4/2021 |
| DE | 102020124054 | 4/2021 |

(Continued)

OTHER PUBLICATIONS

"U.S. Appl. No. 16/600,917, Notice of Allowance dated Jun. 11, 2021", 9 pgs.

(Continued)

*Primary Examiner* — Alvaro E Fortich
(74) *Attorney, Agent, or Firm* — Schwegman Lundberg & Woessner, P.A.

(57) ABSTRACT

A pin driver control system for enhancing pulse fidelity can include a first current switch circuit with a current input node and a voltage input node, wherein the first current switch circuit provides a switched output current signal in response to a voltage control signal at the voltage input node. The system can further include a first current source configured to receive a bias control signal and, in response, provide a drive current signal to the current input node of the first current switch. The drive current signal can have a magnitude that exceeds a magnitude of the switched output current signal. The system can further include a bias control circuit configured to receive information about a desired bias current magnitude for use by the first current switch circuit and, in response, provide the bias control signal to the first current source.

20 Claims, 5 Drawing Sheets

(56) References Cited

U.S. PATENT DOCUMENTS

| | | |
|---|---|---|
| 6,642,734 B1 | 11/2003 | Tsuyuki et al. |
| 6,677,775 B2 | 1/2004 | Babcock |
| 6,703,825 B1 | 3/2004 | Creek et al. |
| 6,856,129 B2 | 2/2005 | Thomas et al. |
| 7,102,375 B2 | 9/2006 | Walker et al. |
| 7,248,035 B2 | 7/2007 | Babcock et al. |
| 7,268,573 B2 | 9/2007 | Jang et al. |
| 7,589,549 B2 | 9/2009 | Kamo et al. |
| 7,755,377 B2 | 7/2010 | Kamo et al. |
| 8,922,271 B1 | 12/2014 | Moothedath et al. |
| 10,180,453 B2 | 1/2019 | King |
| 11,125,817 B2 | 9/2021 | Mcquilkin |
| 2005/0007138 A1* | 1/2005 | Luk .................... G01R 1/07385 324/750.01 |
| 2006/0279304 A1* | 12/2006 | Kuitani ................ G01R 35/005 324/750.22 |
| 2007/0096817 A1 | 5/2007 | Sutardja |
| 2010/0030508 A1* | 2/2010 | Gake ................ G01R 31/31928 702/117 |
| 2016/0006395 A1 | 1/2016 | Kim et al. |
| 2021/0109155 A1 | 4/2021 | Mcquilkin |

FOREIGN PATENT DOCUMENTS

| | | |
|---|---|---|
| JP | H08285926 | 11/1996 |
| JP | 2000292502 | 10/2000 |
| JP | 2009192528 | 8/2009 |
| JP | 2011055484 | 3/2011 |
| JP | 2017173318 | 9/2017 |

OTHER PUBLICATIONS

Ichiyama, Kiyotaka, et al., "A Functional Test of 2-GHz/4-GHz RF Digital Communication Device Using Digital Tester", IEEE International Test Conference (ITC), (2013), 10 pgs.

"Japanese Application Serial No. 2020-172545, Notification of Reasons for Refusal dated Oct. 25, 2021", w/ English Translation, 16 pgs.

U.S. Appl. No. 16/600,917 U.S. Pat. No. 11,125,817, filed Oct. 14, 2019, Compound Pin Driver.

* cited by examiner

COMPOUND PIN DRIVER CONTROLLER

BACKGROUND

A test system for electronic device testing can include a pin driver circuit that provides a voltage test pulse to a device under test (DUT). In response, the test system can be configured to measure a response from a DUT, such as to determine whether the DUT meets one or more specified operating parameters. A test system can optionally include multiple driver circuits, such as a class AB driver circuit and a class A driver circuit to provide circuit test signals having different amplitude or timing characteristics. In an example, the test system is configured to measure a response from a DUT using an active load and a comparator circuit to sense transitions at a DUT pin.

A system for testing digital integrated circuits (ICs) can include a driver circuit configured to provide multiple voltage levels (e.g., Vhigh, Vlow and Vterm) to a DUT. The DUT can exhibit bidirectional (I/O) capability in that it can both source and receive stimulus. The driver circuit's Vhigh and Vlow levels serve to stimulate a DUT while in its "input" state, and Vterm acts as a termination for the DUT in its "output" state. The process of switching between Vhigh, Vlow, and Vterm can be conceptualized as a collection of three switches, with one terminal of each switch connected to either Vhigh, Vlow, or Vterm, and the other terminal connected to a common 50 ohm resistor, which is then connected to the DUT node. In this way, transitions between the three levels can be realized by opening and closing the appropriate switches, such as with only one switch closed at any given time.

A feature of automated test equipment, or ATE test systems, is an ability to deliver precisely timed Vhigh, Vlow, and Vterm signals or transitions to the DUT. It can be critical for a test system to provide substantially constant propagation delays and predictable signal edge placement independent of variables like temperature, frequency, duty cycle, pulse width or test vector history that can compromise efficacy of a test system.

BRIEF SUMMARY

The present inventor has recognized, among other things, that a problem to be solved includes providing a test signal generator system that is relatively small, inexpensive to produce, consumes less power than traditional systems, or provides higher fidelity performance relative to traditional systems. For example, the problem can include providing a test signal generator with improved pulse edge placement accuracy or improved bandwidth characteristics.

In an example, a solution to these and other problems can include a driver system with a compound stage. The compound stage can accommodate a large range of voltage and current input and output signals, and can support high bandwidth signals with improved accuracy. In an example, the compound stage can include a first input that can receive voltage signals and can include a second input that can receive current signals, and can provide a compound output signal based on a combination of the received voltage and current signals. In an example, a test system that includes the compound stage can have power handling characteristics similar to those of a class AB driver and can have bandwidth characteristics similar to those of a class A driver.

In an example, the compound stage provides a high impedance environment and thus devices used in a front-end switching or driver circuit can be many times smaller than devices that would be used in a traditional class A switching circuit. Furthermore, since switching operations can be performed inside the high impedance environment of the compound stage, front-end switching current signals can be many times smaller than current signals that would be used in a traditional class A switching circuit.

In an example, the compound stage can also help isolate front-end driver or switching stages from a DUT. With the improved isolation over traditional driver arrangements, parasitic loading effects can be reduced and bandwidth can be improved. Accordingly, smaller or fewer capacitance-cancelling devices can be used, or can be omitted altogether.

In an example, a solution to the above-mentioned problems can include a control system for a pin driver, such as a pin driver using a compound stage. The control system can include a first current switch circuit including a current input node and a voltage input node, and the first current switch circuit can be configured to provide a switched output current signal in response to a voltage control signal at the voltage input node. The control system can further include a first current source configured to receive a bias control signal and, in response, provide a drive current signal to the current input node of the first current switch, and the drive current signal can have a magnitude that exceeds a magnitude of the switched output current signal. In an example, the control system can include a bias control circuit configured to receive information about a desired bias current magnitude for use by the first current switch circuit and, in response, provide the bias control signal to the first current source. In an example, the control system can further include a buffer circuit to receive or monitor a control voltage from the bias control circuit and, in response, provide a corresponding voltage control signal at the voltage input node of the first current switch circuit.

In an example, a solution to the above-mentioned problems can include a method for providing a switched test signal to a device under test using a first current switch, such as with the first current switch configured to use a drive current signal to provide the switched test signal with a non-zero high-side value and a non-zero low-side value. The method can include receiving information about a desired bias current magnitude for the first current switch (e.g., receiving an i_ClassA signal), receiving information about a desired magnitude difference between the high-side value and the low-side value of the switched test signal (e.g., receiving an i_Swing value), receiving a timing signal configured to control switching of the switched test signal between the high-side value and the low-side value, and generating a first control signal for controlling a first current source based on the received information about the desired bias current magnitude and the information about the desired magnitude difference between the high-side value and the low-side value of the switched test signal. In an example, the method can further include generating a second control signal for controlling the first current switch based on the received information about the desired bias current magnitude and the timing signal.

In an example, a solution to the above-mentioned problem can include or use the switching stage described herein to drive a compound stage of a driver system. For example, the switching stage can be used to provide a switched current signal to the compound stage described by McQuilkin in U.S. patent application Ser. No. 16/600,917 titled "Compound Pin Driver" which is incorporated herein by reference.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

A pin driver circuit of a test system can provide a voltage pulse stimulus to a device under test (DUT) at a specified time, and optionally can measure a response from the DUT. The test system can be configured to provide high fidelity output signal pulses over a relatively large output signal magnitude range to accommodate different types of devices under test. In some examples, a test system includes a physically large current switching stage to facilitate large voltage swings. Such a large current switching stage, however, can present a liability for producing small voltage swings because spurious signals, such as due to parasitic effects associated with a physically large switching stage that can detract from test signal waveform fidelity and test signal bandwidth.

The test systems and methods described herein provide, among other things, a pin driver architecture that can improve fidelity and minimize overshoot or spiking of high frequency current signals, and can enhance pulse edge placement accuracy and signal bandwidth at high or low power operating levels. In an example, the systems described herein can include a class A driver stage that is configurable to provide a variety of pulse signals. The systems can include control circuits to precisely control switching control voltage signals and switching current signals. In an example, the control circuits can use information about a desired bias current magnitude, or "class A depth," and information about a desired magnitude of a switched output signal, to provide a high fidelity switched output current signal.

In an example, the systems described herein can include or use a compound stage to receive and combine signals from multiple different driver circuits before providing the signals to a DUT. In an example, the compound stage can include a voltage signal amplifier circuit, such as configured to receive and process signals from a class AB driver stage, and a transimpedance circuit, such as configured to receive and process signals from a class A driver stage. Additional driver stages, or multiple instances of one or more types of driver stages, can optionally be used together with the compound stage discussed herein.

In an example, multiple drivers or driver stages can be used to provide a test system that is configurable to test a variety of semiconductor devices with varying voltage and speed requirements. Furthermore, multiple drivers can be used to enhance or enable multiple signal level testing or "multiplexing" for physical layer testing. During physical layer testing, the multiple drivers can be switched concurrently to provide various different stimuli or drive signals to a DUT.

In an example, a class AB driver can be configured to deliver a large range of different voltage magnitude signals and can be configured to consume a minimum amount of power. The class AB driver can have moderate bandwidth and timing accuracy. The class AB driver can include or use diode bridges, differential pairs of transistors, or other switching elements. In an example, a class AB driver can be configured for moderate speed testing of system-on-a-chip circuits or other circuits or devices.

In an example, a class A driver can be configured to deliver relatively low magnitude current signals and can be configured for high bandwidth and timing accuracy. In an example, a class A driver can be configured to switch larger current signals, for example, directly at an output node of the driver or at the input of the DUT. In an example, a class A driver can be configured for high speed testing of memory circuits or other devices.

In an example, use of a class A driver can reduce an overall bandwidth of a test system because of its parasitic loading on the DUT, for example, due to large constituent devices that are used to switch large current signals at the DUT. In an example, some test systems can include capacitance-cancellation elements to counteract loading effects of the class A driver, however, such elements can be physically large and can contribute to increased part size and die cost. In an example, class A driver control circuits and/or a compound stage, as discussed herein, can be used together to reduce or eliminate a need for such cancellation elements.

Figure 1:
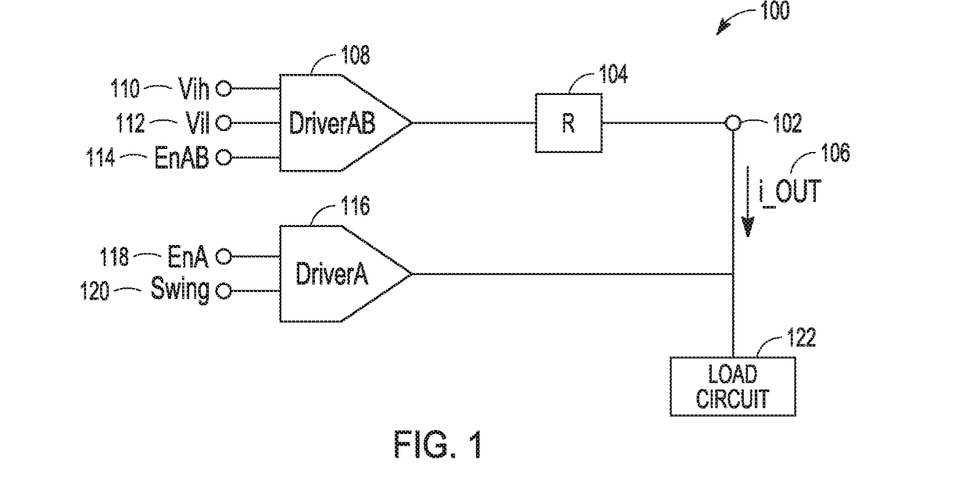
FIG. 1 illustrates generally an example of a test system topology including multiple driver circuits.

FIG. 1 illustrates generally a first example 100 of a test system topology including multiple driver circuits. The first example 100 includes a first DriverAB 108 that can include a class AB driver circuit, and a first DriverA 116 that can include a class A driver circuit. The first example 100 can further include an output element such as a first resistor 104 that can be configured to provide a specified output or load impedance. In an example, the first example 100 can include a first load circuit 122, such as can include a comparator circuit, an active load, or other loading device. In an example, the test system is configured to provide a first output current 106, i_OUT, at a DUT pin 102.

In an example, the first DriverAB 108 can be configured to produce a voltage stimulus signal by selecting between parallel-connected diode bridges with each bridge driven by a unique, dedicated DC voltage level. In the first example 100 of FIG. 1, DC voltages Vih 110 and Vil 112 drive diode bridges in the first DriverAB 108. The switching stage can be followed by a voltage buffering stage that can provide power gain, such as can be used to produce large currents to serve a 50 ohm DUT environment.

In contrast with the first DriverAB 108, the first DriverA 116 can be configured to produce transitions at the DUT pin 102 using a relatively large current switch stage that can be coupled directly to the DUT pin 102. A current switching stage in the first DriverA 116 can alternately switch current into and out of the DUT pin 102 in response to a control signal Swing 120, such as can be a voltage control signal. The first DriverA 116 can provide high speed operation, for example, because it may be unburdened by the class AB voltage buffering stage with its attendant bandwidth limitations and other performance limitations.

In an example, the first DriverA 116 can be configured to provide a relatively low amplitude signal at the DUT pin 102. For example, the first DriverA 116 can provide a signal having about a 2 volt swing. The first DriverAB 108 can be configured to provide a relatively high amplitude signal at the DUT pin 102, for example, −1.5 to +7 volts. The first DriverA 116 generally operates at a higher switching speed or bandwidth than the first DriverAB 108. In an example, the first DriverAB 108 can be configured to absorb switching currents from the first DriverA 116. That is, the first DriverAB 108 can serve as a buffer that the first DriverA 116 can source current into, such as through the first resistor 104.

One or both of the first DriverAB 108 and the first DriverA 116 can be selected to fulfill disparate DUT test requirements that may not otherwise be fulfilled by a single driver. For example, while both driver circuits can provide DUT waveforms, the first DriverAB 108 can be configured to provide large amplitude, low bandwidth stimulus signals, and the first DriverA 116 can be configured to provide low amplitude, high bandwidth stimulus signals.

In an example, the first DriverAB 108 and the first DriverA 116 do not share an enable pin. Instead, each driver circuit includes an independent enable control through pins EnAB 114 and EnA 118. The independent enable control facilitates the first DriverAB 108 to serve as a low speed, high voltage stimulus source, and to serve as a static, non-transitioning buffer to absorb switching currents from the first DriverA 116.

Figure 2:
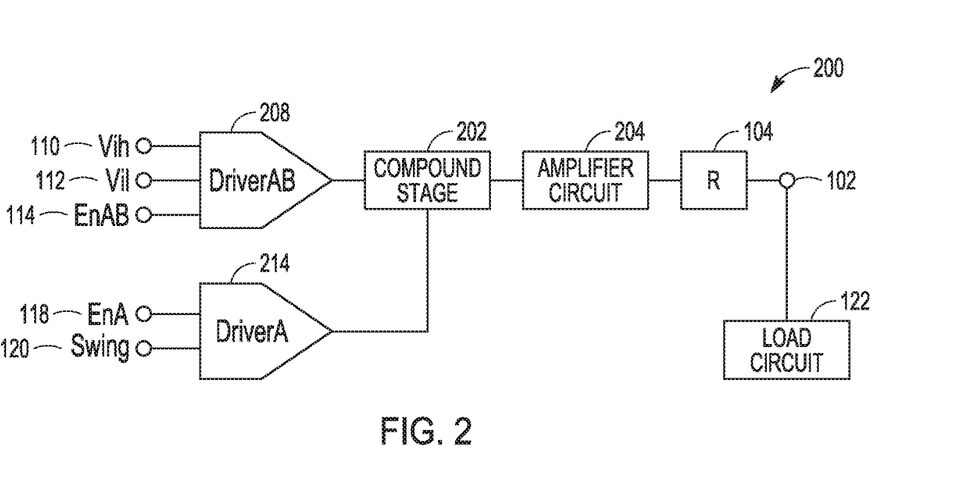
FIG. 2 illustrates generally an example of a test system topology including a compound stage and multiple driver circuits.

FIG. 2 illustrates generally a second example 200 of a test system topology including a compound stage 202 and multiple driver circuits. The second example 200 can include a second DriverAB 208 and a second DriverA 214. In an example, the second DriverAB 208 can be the same or similar device as the first DriverAB 108 and the second DriverA 214 can be the same or similar device as the first DriverA 116 from the example of FIG. 1.

In an example, the second DriverA 214 can be a physically smaller device than the first DriverA 116. For example, the second DriverA 214 can be at least one and optionally multiple orders of magnitude smaller than the first DriverA 116. The second DriverA 214 can be configured to provide signals that have similar timing characteristics but different amplitude characteristics than the first DriverA 116. In an example, the second DriverA 214 can be more cost-effective to manufacture than the first DriverA 116 because it can occupy less die area or can include or use components having more lenient performance requirements.

The second example 200 can further include the first resistor 104, the DUT pin 102, and the first load circuit 122, such as can be the same or similar to the items as described above in the discussion of FIG. 1. That is, the second DriverAB 208 and second DriverA 214 of the second example 200 can be used interchangeably with the drivers from the example of FIG. 1 to provide signals to a DUT via the DUT pin 102, or the second DriverAB 208 and second DriverA 214 can be terminated with the same first resistor 104 or first load circuit 122, as in the example of FIG. 1.

The second example 200 can further include a compound stage 202 and a first amplifier circuit 204. The compound stage 202 can be configured to receive test signals from the second DriverAB 208 and from the second DriverA 214 and, in response, provide signals to the DUT pin 102 via the first amplifier circuit 204. The first amplifier circuit 204 can be configured to buffer or amplify signals from the compound stage 202 for delivery to the DUT pin 102. In an example, the compound stage 202 can concurrently or sequentially receive and respond to signals from the second DriverAB 208 or second DriverA 214.

The compound stage 202 can provide a relatively high input impedance environment for signals received from the second DriverAB 208 or the second DriverA 214. Accordingly, switching signals provided by one or both of the second DriverAB 208 or second DriverA 214 can be relatively smaller than signals provided by, for example, the first DriverAB 108 or the first DriverA 116 in the first example 100 from FIG. 1. For example, switching current signals from the second DriverA 214 can be one or more orders of magnitude smaller than signals from the first DriverA 116. The compound stage 202 can receive the smaller signals, convert them to voltage signals, and then deliver the signals to the DUT pin 102 via the first amplifier circuit 204. With the second DriverA 214 isolated from the DUT pin 102 by the compound stage 202 and the first amplifier circuit 204, parasitic loading from the second DriverA 214 can be reduced or eliminated and thus cancellation components or other mitigating circuitry can be omitted from the signal path.

Figure 3:
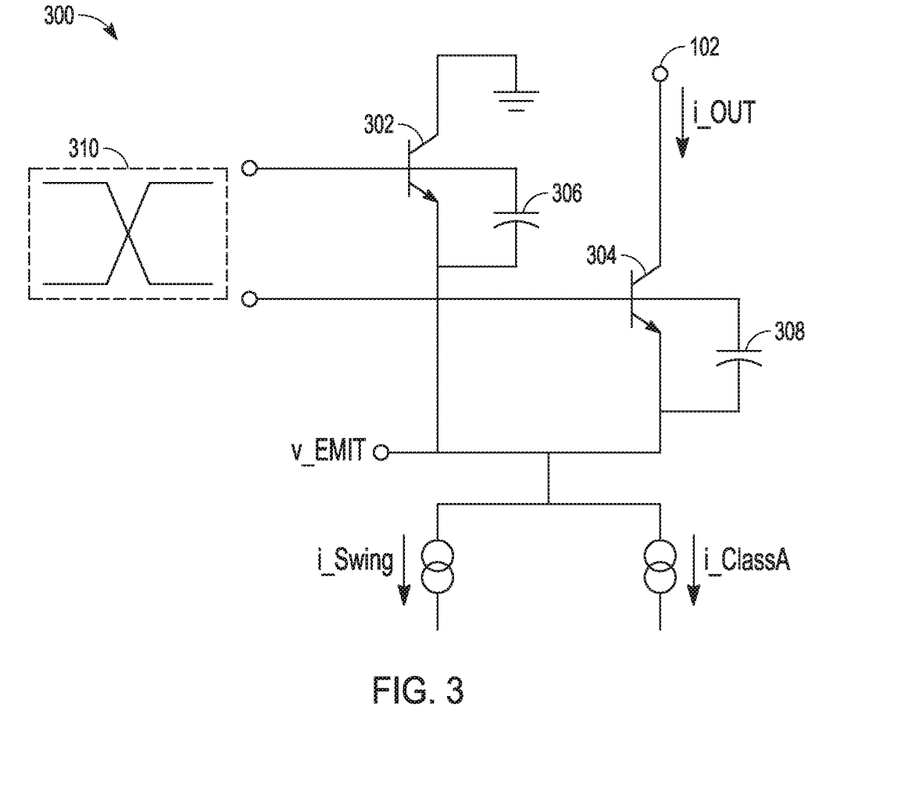
FIG. 3 illustrates generally an example of a Class A switching stage.

FIG. 3 illustrates generally an example 300 of a class A switching stage. The example 300 includes a differential pair of transistors that switches current (e.g., i_OUT) to or from the DUT pin 102. The differential pair includes a first switch 302 and a second switch 304. Each of the first switch 302 and the second switch 304 has a characteristic parasitic capacitance represented by first parasitic capacitance 306 and second parasitic capacitance 308 respectively. The first switch 302 and the second switch 304 are configured to switch an output current signal based on voltage control signals 310, such as can be provided at the bases of the switch devices. In an example, the differential pair can be configured to switch a drive current signal, such as received from a current source, to provide a DUT test signal at the DUT pin 102.

In an example, a physical size of the differential pair in the example 300 of a class A switching stage can be fixed or variable. For example, a physical size of the differential pair can be adjusted as described by McQuilkin in U.S. patent application Ser. No. 15/074,533, titled "Segmented Pin Driver System" and which is incorporated herein by reference in its entirety. McQuilkin '533 indicates, for example, that test system switch sizes can be selected based on slew or current transition speed requirements to drive a DUT pin with a relatively large voltage amplitude signal swing in a small amount of time, and a driver circuit can employ physically large switches to produce a relatively large amount of slew current.

In an example, a physical size of the differential pair can be fixed. To help address parasitic capacitances associated with the differential pair, a bias current or i_ClassA current can be provided together with a swing signal or i_Swing current used as the output signal.

Figure 4:
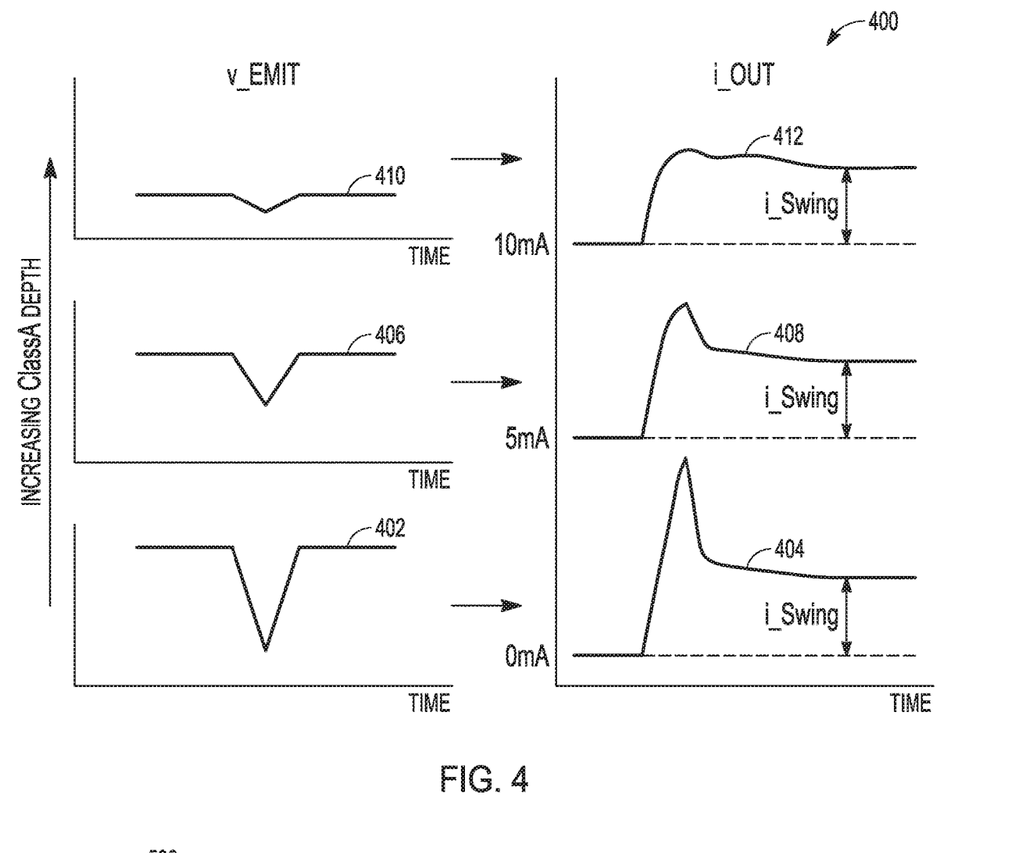
FIG. 4 illustrates generally a series of corresponding voltage and output current waveforms for the example in FIG. 3.

FIG. 4 illustrates generally a series of corresponding voltage and output current waveforms for the example 300 of FIG. 3. For example, FIG. 4 shows, at left, different voltage signal waveforms at node v_EMIT from the example 300, and FIG. 4 shows, at right, respective corresponding output current signal i_OUT waveforms.

At the first input current node voltage chart 402, a morphology or shape of the v_EMIT signal is typical of the differential pair from the example 300 containing zero or minimal class A current, as evidenced by the i_OUT starting value of 0 mA in the first switched output current signal chart 404. The spike or spurious signal transient in the first switched output current signal chart 404 can be due in large part to the first switch 302 turning completely off, followed by the second switch 304 turning on. The current spike can result from the second switch 304 charging the first parasitic capacitance 306 and second parasitic capacitance 308, such as can represent high frequency loading on at the v_EMIT node. The current spike can carry through to provide an undesirable voltage spike at the DUT pin 102 that, in turn, can cause decreased fidelity and a departure from an ideal pulse waveform shape.

In an example, the i_OUT spike in the first switched output current signal chart 404, such as can be produced by a fully switching differential pair, can be substantially independent of an absolute value of i_Swing. That is, even if the entirety of i_Swing is switched during a transition, the current spike magnitude can be substantially unchanged. A problem that results is that the current spike represents an increasing portion of the overall i_OUT waveform as i_Swing decreases, thereby degrading signal fidelity. The magnitude of the spike is determined primarily by the amplitude of v_EMIT and the first parasitic capacitance 306 and the second parasitic capacitance 308 that are present at the v_EMIT node.

In an example, an approach for decreasing an output signal spike amplitude includes reducing the v_EMIT node capacitance or reducing the v_EMIT amplitude. In an example, another approach includes avoiding switching the differential pair fully, and instead switching a portion of a total available current. An amount of current that is not switched is referred to herein as a "bias current" or a "class A current" and a ratio of the unswitched portion to the total current in the differential pair is referred to herein as a class A "depth."

Referring again to FIG. 3, the example 300 includes a current source i_ClassA that represents a class A depth, that is, a portion of the current in the differential pair that is not switched. The i_ClassA current can bias the differential pair to an always-on state. The first input current node voltage chart 402, second input current node voltage chart 406, and third input current node voltage chart 410 in FIG. 4 illustrate the effect of increasing class A depth on v_EMIT amplitude and correspondingly on the i_OUT current, for example, as i_Swing is kept constant. The first input current node voltage chart 402 and the first switched output current signal chart 404 represent a 0% depth, as evidenced by the initial i_OUT value of 0 mA. The third input current node voltage chart 410 and the third switched output current signal chart 412 represent a high class A depth, which in turn yields a relatively high fidelity i_OUT waveform. The second input current node voltage chart 406 and the second switched output current signal chart 408 represent a moderate or intermediate class A depth with relatively poor fidelity.

In practice, achieving a high fidelity i_OUT waveform at small i_Swing values, as represented by the third switched output current signal chart 412, can require or use substantial class A depth. As a result, information contained in i_Swing coexists with a class A current "noise." High class A current depth can make it more difficult to produce a known current signal i_Swing and thus a known i_OUT at the DUT pin 102. In an example, various control loop circuits as discussed herein can be used to control a switching current available at a main switching stage, such as in the differential pair in the example 300 of FIG. 3.

Figure 5:
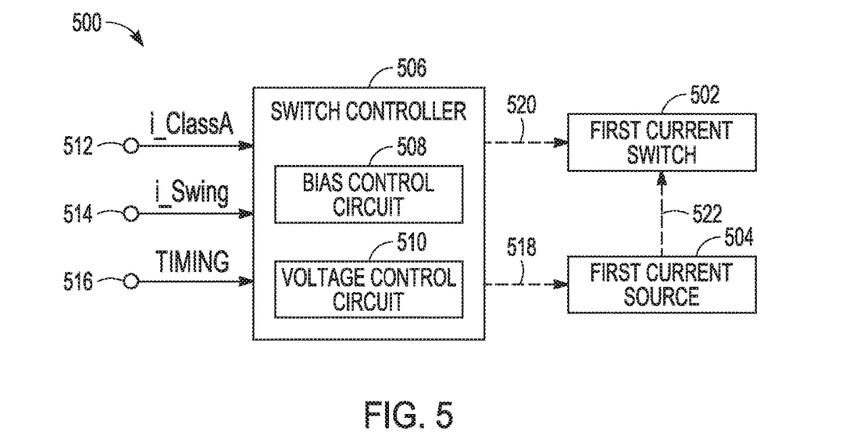
FIG. 5 illustrates generally an example of a block diagram of a first pin driver control system.

FIG. 5 illustrates generally an example of a block diagram 500 of a first pin driver control system. The first pin driver control system can include a first current switch 502, a first current source 504, and a switch controller 506. In an example, the first current switch 502 can include or use the differential pair of transistors from the example 300 of FIG. 3. That is, the first current switch 502 can, in an example, comprise the first switch 302 and the second switch 304.

In an example, the switch controller 506 can be configured to provide control signals to the first current switch 502 or to the first current source 504. For example, the switch controller 506 can include a processor circuit, a logic circuit, or other circuitry that can provide a first control signal 518 to the first current source 504 and can provide a second control signal 520 to the first current switch 502.

The switch controller 506 can include an integrated structure that provides the first control signal 518 and the second control signal 520 or the switch controller 506 can comprise multiple discrete control structures such as can be configured to work together to provide one or more of the first control signal 518 and the second control signal 520. In an example, the switch controller 506 includes a bias control circuit 508 that is configured to provide the first control signal 518. The switch controller 506 can further include a voltage control circuit 510 that is configured to provide the second control signal 520. In an example, the switch controller 506, the bias control circuit 508, and the voltage control circuit 510 generate or determine the first control signal 518 and the second control signal 520 based on, and in response to, one or more input signals.

In an example, the input signals can be received at a bias current node 512, a swing current node 514, and a timing node 516. In an example, the bias current node 512 can receive a signal that includes or provides information about a desired bias current magnitude, or i_ClassA current for use by devices in the first current switch 502. In an example, the swing current node 514 can receive a signal that includes or provides information about a desired magnitude of a switched output current signal swing, such as can be provided using the first current switch 502. The information about the desired magnitude of the output signal can include information about a desired magnitude difference between high-side and low-side values of an output signal provided to the DUT pin 102. The low-side value can be zero or can be non-zero. In an example, the timing node 516 can receive a timing signal that includes or provides information about a switch timing or status of one or more of the switches in the first current switch 502.

In an example, one or more devices can comprise the first current switch 502. As similarly described above in the discussion of FIG. 3, the switch controller 506 can be configured to provide the second control signal 520, such as including or corresponding to the voltage control signals 310, to devices comprising the first current switch 502, such as the first switch 302 and the second switch 304. In turn, the first current switch 502 can be configured to provide a switched output signal at the DUT pin 102.

In an example, the first current source 504 can comprise an adjustable or variable current source that can provide a current signal to, or sink a current signal from, the first current switch 502. That is, the first current source 504 can provide a drive current signal for use by the first current switch 502. The drive current signal can include a combination or sum of an i_ClassA current and an i_Swing current. The magnitude of the drive current signal, or the Class A depth, can be determined or provided by the first control signal 518 from the switch controller 506.

In operation, the first pin driver control system can be used to provide a switched test signal to a device under test (DUT) using the first current switch 502. The first current switch 502 can use the drive current signal 522 from the first current source 504 to provide the switched test signal with a non-zero high-side value and a zero or, preferably, a non-zero low-side value. In an example, the switch controller 506 can be configured to receive information about a desired bias current magnitude or class A depth. The bias information can be received from the bias current node 512 and the resulting bias signal can be provided for use by one or more devices in the first current switch 502.

The switch controller 506 can be further configured to receive information about a desired magnitude difference between the high-side value and the low-side value of the switched test signal. The desired magnitude difference information can be received via the swing current node 514. The switch controller 506 can be further configured to receive a timing signal, such as at the timing node 516. Information from the timing signal can be used to control switching of the switched test signal between the high-side value and the low-side value.

In response to the signals received at the bias current node 512, the swing current node 514, and the timing node 516, the switch controller 506 can generate the first control signal 518 for controlling the first current source 504 based on the received information about the desired bias current magnitude and the information about the desired magnitude difference between the high-side value and the low-side value of the switched test signal. In an example, the switch controller 506 can concurrently generate the second control signal 520 for controlling the first current switch 502 based on the received information about the desired bias current magnitude and the timing signal.

Figure 6:
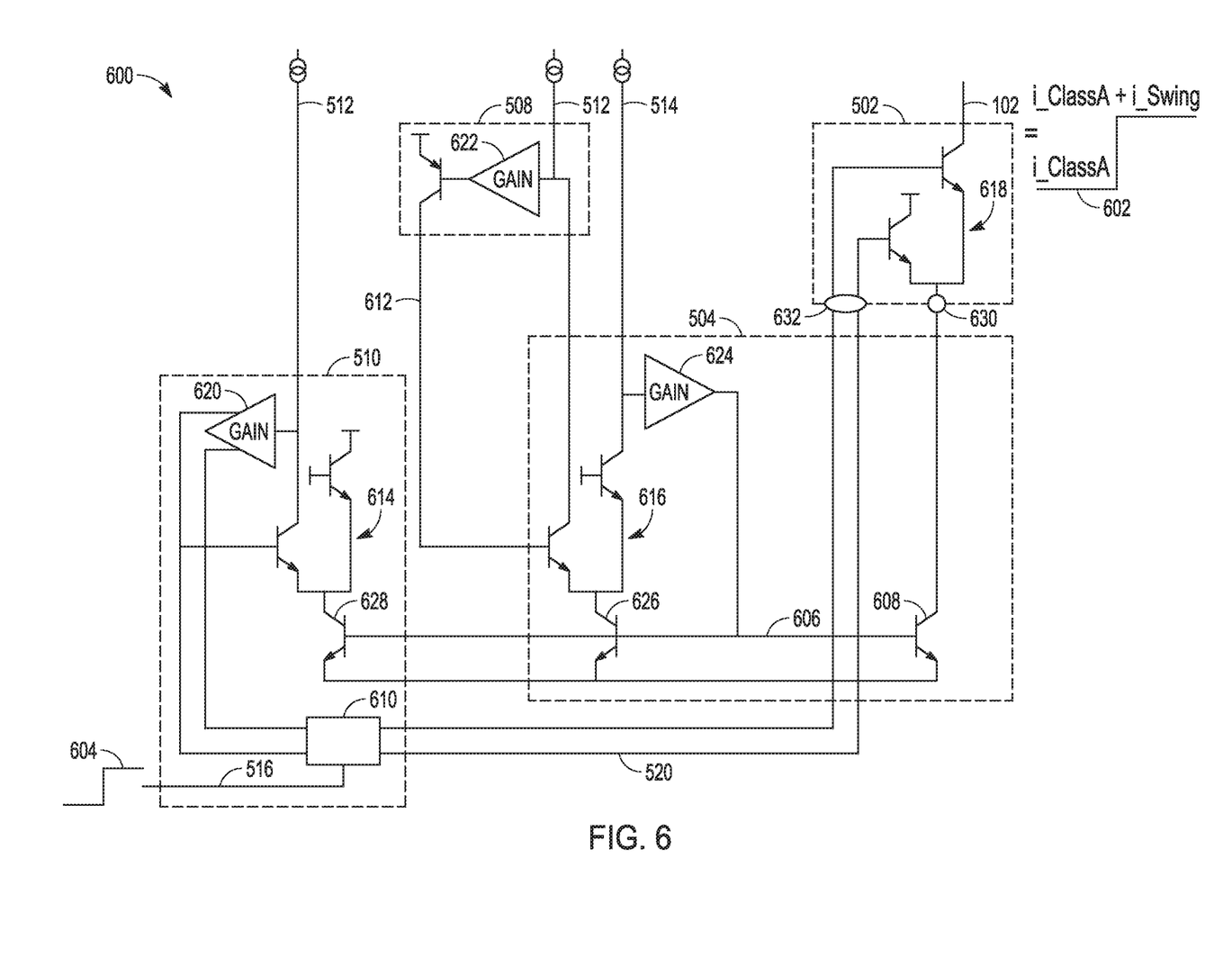
FIG. 6 illustrates generally an example of a schematic diagram of the first pin driver control system from FIG. 5.

FIG. 6 illustrates generally an example of a schematic diagram 600 of the first pin driver control system from the example of FIG. 5. The first pin driver control system, as shown in the schematic diagram 600, can include various components comprising the first current switch 502 and the first current source 504. The first pin driver control system can include various components comprising the switch controller 506 from the example of FIG. 5, such as including the bias control circuit 508 and the voltage control circuit 510. In an example, the first current source 504, the bias control circuit 508, and the voltage control circuit 510 comprise control circuitry, or control loops, that can work together to serve the competing interests of maintaining a desired switched output signal at the DUT pin 102 and maintaining a desired a bias current through an off-side device in the first current switch 502.

The schematic diagram 600 of FIG. 6 illustrates generally how information about test parameters, such as including i_ClassA bias information, timing information, and i_Swing information, can be received and interpreted to produce high fidelity switching signals at the DUT pin 102. In an example, various copies or matched circuits can be used to replicate information or signals from, for example, a high frequency stage of the driver to other control stages. For example, a control loop can use the test parameter information to establish a drive current for the first current switch 502. Various DC information from the control loop can be copied (e.g., via matched circuitry) to switch devices in the first current switch 502 and used, such as together with a chopper or timing circuit, to provide switching signals to the devices in the first current switch 502.

In an example, the first current switch 502 comprises a current switch differential pair 618 of BJT transistors. A first one of the transistors in the current switch differential pair 618 can include a collector terminal coupled to the DUT pin 102 and configured to provide a switched output current signal 602. The switched output current signal 602 can have a low-side value of i_ClassA, such as corresponding to a zero or non-zero bias current magnitude, and the switched output current signal 602 can have a high-side value that is greater than i_ClassA, such as by an amount of the magnitude of i_Swing. In an example, a magnitude of i_ClassA can be defined by a user, by various use conditions, or can be determined through trial and error. Generally, i_ClassA can be determined empirically for given test conditions and can represent a minimum amount of current to use in an off-side device in the current switch differential pair 618 at any given time to enhance test system performance and signal fidelity. Values of i_Swing can be fixed or variable depending on the DUT or the test to be performed.

In an example, the first current switch 502 includes a current input node 630 that is configured to receive or provide a drive current signal. A magnitude of the drive current signal can be at least equal to a sum of i_CassA and i_Swing. In an example, the first current switch 502 includes a voltage input node 632. The voltage input node 632 can receive the second control signal 520, such as from the voltage control circuit 510. In an example, the second control signal 520 comprises a differential voltage signal that can be provided to the base terminals of the transistors of the current switch differential pair 618. In response to signals at the voltage input node 632, the current switch differential pair 618 can switch a drive current signal at the current input node 630 into or out of the DUT pin 102. That is, the first current switch 502 can include the current input node 630 and the voltage input node 632, and the first current switch 502 can be configured to provide a switched output current signal at the DUT pin 102, such as in response to and using one or more of the first control signal 518 and the second control signal 520 from the switch controller 506.

In the example of FIG. 6, the first current source 504 comprises circuitry configured to receive information from the bias current node 512 and the swing current node 514 and, in response, provide the drive current signal to the current input node 630 of the first current switch 502. In an example, the first current source 504 can include a tail current control circuit configured to receive information from the bias current node 512 about a desired bias signal magnitude and to receive information from the swing current node 514 about a desired magnitude of the switched output current signal. In response, the tail current control circuit can provide a tail current control signal 606. A tail current source device 608 can receive the tail current control signal 606 and, in response, provide the drive current signal 522. For example, in FIG. 6, the tail current control circuit can comprise a tail current control differential pair 616 such as can comprise a pair of transistor devices that are matched to, or a copy of, the current switch differential pair 618. The tail current control circuit can further comprise a second tail current mirror device 626, such as can be matched to, or a copy of, the tail current source device 608. In an example, the first current source 504 comprises a third buffer circuit 624 coupled between the swing current node 514 and the base terminal, or input, of the tail current source device 608. In operation, the gain network comprising the third buffer circuit 624 is configured to drive a current signal through one of the transistors in the tail current control differential pair 616 such that the driven current signal and the switched output current signal at the DUT pin 102 have substantially the same magnitude.

In an example, the bias control circuit 508 is configured to receive information about desired bias conditions from the bias current node 512 and use the first current source 504 to ensure appropriate bias conditions for the first current switch 502 to minimize overshoot and mitigate capacitive loading issues, as discussed elsewhere herein. In an example, the bias control circuit 508 comprises a second buffer circuit 622 or gain circuit that is configured to use information from the bias current node 512 to provide the tail current control signal 606 to the tail current source device 608.

In operation, the first current source 504 and the bias control circuit 508 work together to establish a tail current (e.g., the drive current signal 522 from the example of FIG. 5), to be provided by the tail current source device 608 to satisfy test conditions, and such test conditions can be input to the test system at the bias current node 512 and the swing current node 514. By using the test condition information to establish operating conditions for the tail current control differential pair 616, voltage conditions for use by the current switch differential pair 618 can be indirectly established owing to the matched differential pairs. In other words, the information received at the bias current node 512 and the swing current node 514 can be applied to the tail current control differential pair 616 to establish various operating conditions commensurate with particular test conditions. The operating conditions can be mirrored to the current switch differential pair 618 in the first current switch 502 to thereby provide the desired switched output current signal 602.

In the example of FIG. 6, the voltage control circuit 510 can be configured to receive information about the desired bias conditions, such as from the bias current node 512, and to receive a timing signal 604 at the timing node 516. In response, the voltage control circuit 510 can provide the second control signal 520, such as comprising a differential timing signal, to the voltage input node 632 of the first current switch 502. That is, the voltage control circuit 510 can generate switching signals to control the first current switch 502 and thereby control the switched output current signal 602 at the DUT pin 102. The voltage control circuit 510 can use a signal converter circuit 610 to receive the timing signal 604 and receive information from a first buffer circuit 620 about the bias information and, in response, the signal converter circuit 610 can generate or provide the second control signal 520, such as can include a differential signal for controlling the respective base terminals of the transistors comprising the current switch differential pair 618. In an example, the voltage control circuit 510 can comprise a voltage control differential pair 614 such as can be matched to, or can be a copy of, the current switch differential pair 618 and/or can be matched to, or can be a copy of, the tail current control differential pair 616. In an example, the various instances of the differential pairs in each of the first current switch 502, the first current source 504, and the voltage control circuit 510 are matched.

In an example, such as alternatively to using the voltage control circuit 510, a buffer circuit can be used to receive information about respective voltages at the base terminals of the first and second transistors of the tail current control differential pair 616. Based on the base terminal voltages, the buffer circuit can provide corresponding voltages at the respective base terminals of the current switch differential pair 618 of transistors in the first current switch 502. That is, a buffer circuit can be used to monitor a control voltage from the first current source 504 and, in response, can provide a corresponding voltage control signal at the voltage input node 632 of the first current switch 502.

Figure 7:
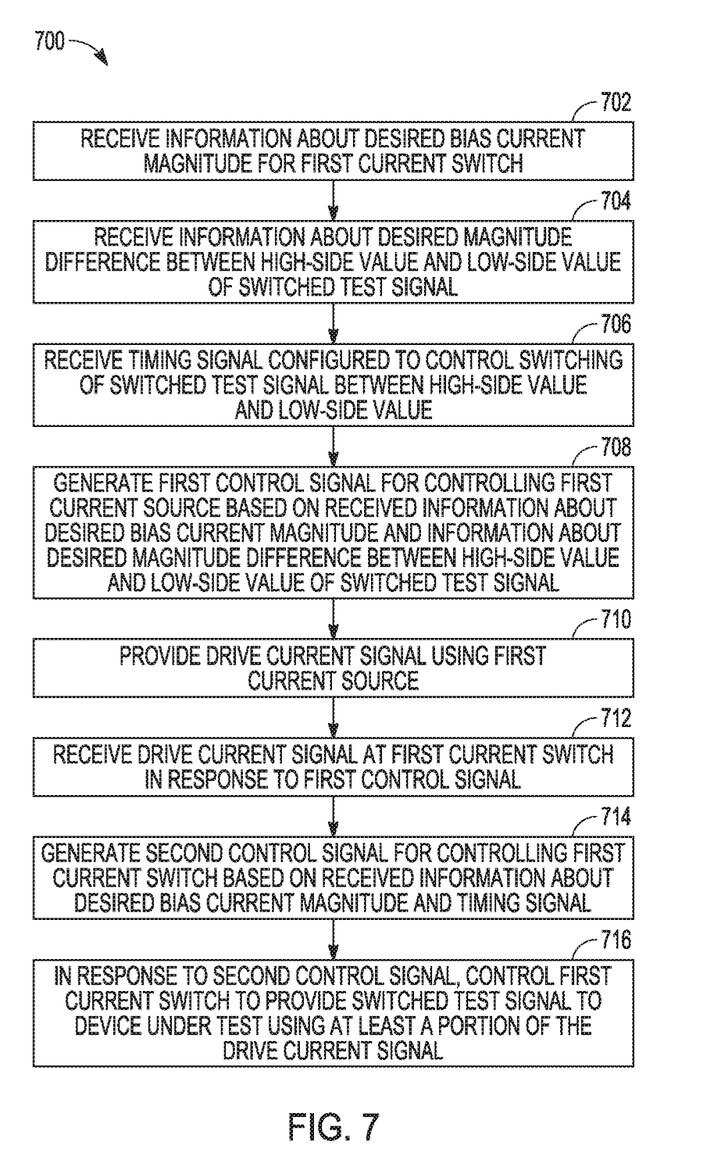
FIG. 7 illustrates generally an example of a method that can include controlling a current switch to provide a switched test signal to a device under test.

FIG. 7 illustrates generally an example of a method 700 that can include controlling a current switch to provide a switched test signal to a DUT, such as at the DUT pin 102. In an example, all or a portion of the method 700 can be performed using the switch controller 506, such as to control the first current switch 502 or the first current source 504. A magnitude of the switched test signal can have a non-zero high-side value and a zero low-side value or, preferably, a non-zero low-side value.

At block 702, the method 700 can include receiving information about a desired bias current magnitude for the first current switch, such as the first current switch 502. In an example, block 702 can include using the bias current node 512 to receive a signal i_ClassA, or to receive a signal that indicates a desired magnitude of the signal i_ClassA. A bias signal corresponding to i_ClassA can be provided for use by one or more switching devices or transistors in the first current switch 502. For example, the bias control circuit 508 and the first current source 504 can receive the information about i_ClassA and, in response, generate or provide a bias signal at the current input node 630 of the first current switch 502.

At block 704, the method 700 can include receiving information about a desired magnitude difference between the high-side value and the low-side value of the switched test signal. In an example, block 704 can include using the swing current node 514 to receive a signal i_Swing, or to receive a signal that indicates a desired magnitude of the signal i_Swing.

At block 706, the method 700 can include receiving a timing signal configured to control switching of the switched test signal between the high-side value and the low-side value. In an example, block 706 can include using the timing node 516 to receive the timing signal 604. The timing signal 604 can include a high frequency clock or pulse signal that indicates when elements in the first current switch 502 are to switch, such as between the high-side value of the switched test signal and the low-side value of the switched test signal.

At block 708, the method 700 can include generating a first control signal for controlling a first current source based on the received information about the desired bias current magnitude and the information about the desired magnitude difference between the high-side value and the low-side value of the switched test signal. In an example, block 708 includes using the bias control circuit 508, and using information received at the bias current node 512 and the swing current node 514, to provide a signal, such as the tail current control signal 606, to a current signal control device, such as the tail current source device 608.

At block 710, the first current source or tail current source device 608 can provide the drive current signal 522 to the first current switch 502. In an example, a magnitude of the drive current signal 522 can be at least equal to, or can exceed, a sum of the magnitudes of the bias signal i_ClassA and the swing signal i_Swing. At block 712, the method 700 can include receiving the drive current signal 522 at the current input node 630 of the first current switch 502.

At block 714, the method 700 can include generating the second control signal 520 for controlling the first current switch 502 based on the received information about the desired bias current magnitude (e.g., i_ClassA) and the timing signal 604. In an example, block 714 can include using the voltage control circuit 510 and information from the bias current node 512 to provide the second control signal 520. The first current switch 502 can receive the second control signal 520 at the voltage input node 632.

At block 716, the method 700 can include controlling the first current switch 502 to provide the switched test signal to a DUT, such as at the DUT pin 102, in response to the second control signal 520. In an example, block 716 can include using timing or switch control information from the voltage input node 632 to determine when each of the different transistor devices of the first current switch 502 is on or off. Block 716 can further include using a current signal, such as the drive current signal 522 received at the current input node 630, for providing the switched test signal to the DUT. In an example, a low-side value of the switched test signal can be about the same as the bias current value of i_ClassA, and a high-side value of the switched test signal can be about the same as a sum of the bias current value of i_ClassA and the value of i_Swing.

In an example, the first current switch 502 can comprise a first differential pair of transistors, and one of the transistors is coupled to the DUT pin 102 to provide the switched test signal. The switch controller 506 can comprise at least a second differential pair of transistors that is matched to, or is a copy of, the first differential pair of transistors in the first current switch 502. In an example, at block 714, generating the second control signal 520 can include using a buffer circuit to receive information about respective base terminal voltages of the second differential pair of transistors. In response to the base terminal voltage information, corresponding voltage signals can be provided to the respective base terminals of the first differential pair that comprises the first current switch 502.

Various aspects of the present disclosure can help provide a solution to the test system-related problems identified herein. In an example, Aspect 1 can include or use subject matter (such as an apparatus, a system, a device, a method, a means for performing acts, or a device readable medium including instructions that, when performed by the device, can cause the device to perform acts, or an article of manufacture), such as can include or use a pin driver control system. In an example, Aspect 1 can include a first current switch circuit including a current input node and a voltage input node, wherein the first current switch circuit is configured to provide a switched output current signal in response to a voltage control signal at the voltage input node, and a first current source configured to receive a bias control signal and, in response, provide a drive current signal to the current input node of the first current switch, wherein the drive current signal has a magnitude that exceeds a magnitude of the switched output current signal. In an example, Aspect 1 can include a bias control circuit configured to receive information about a desired bias current magnitude for use by the first current switch circuit and, in response, provide the bias control signal to the first current source.

Aspect 2 can include or use, or can optionally be combined with the subject matter of Aspect 1, to optionally include or use a buffer circuit configured to monitor a control voltage from the bias control circuit and, in response, provide a corresponding voltage control signal at the voltage input node of the first current switch circuit.

Aspect 3 can include or use, or can optionally be combined with the subject matter of one or any combination of Aspects 1 or 2 to optionally include the first current source, and the first current source can comprise a tail current control circuit configured to receive the bias control signal and information about a desired magnitude of the switched output current signal and, in response, provide a tail current control signal. In an example, Aspect 3 can include a tail current source device configured to provide the drive current signal in response to the tail current control signal.

Aspect 4 can include or use, or can optionally be combined with the subject matter of Aspect 3, to optionally include, in the first current switch circuit and the tail current control circuit, respective matched instances of a differential pair of transistors.

Aspect 5 can include or use, or can optionally be combined with the subject matter of Aspect 4, to optionally include the differential pair in the tail current control circuit comprising first and second transistors, and the tail current control circuit comprising a gain network configured to drive a first current signal through the first transistor, and the first current signal and the switched output current signal can have substantially the same magnitude.

Aspect 6 can include or use, or can optionally be combined with the subject matter of one or any combination of Aspects 1 through 5 to optionally include the bias control circuit having a gain circuit configured to use the received information about the desired bias current magnitude to provide the bias control signal to a first transistor in the first current source.

Aspect 7 can include or use, or can optionally be combined with the subject matter of one or any combination of Aspects 1 through 6 to optionally include or use a voltage control circuit configured to use the information about the desired bias current magnitude and a timing signal to provide the voltage control signal to the voltage input node of the first current switch circuit to thereby control the switched output current signal.

Aspect 8 can include or use, or can optionally be combined with the subject matter of Aspect 7, to optionally include the first current switch circuit, the first current source, and the voltage control circuit comprising respective matched instances of a differential pair of transistors, and the voltage control circuit is configured to provide the voltage control signal as a differential voltage signal at the voltage input node, and the voltage input node comprises base terminals of the differential pair of the first current switch circuit.

Aspect 9 can include or use, or can optionally be combined with the subject matter of one or any combination of Aspects 1 through 8, to optionally include the first current switch circuit configured to provide the switched output current signal as a digital signal having a low-side magnitude corresponding to the desired bias current magnitude and having a high-side magnitude corresponding to a sum of the desired bias current magnitude and the desired magnitude of the switched output current signal.

Aspect 10 can include or use subject matter (such as an apparatus, a system, a device, a method, a means for performing acts, or a device readable medium including instructions that, when performed by the device, can cause the device to perform acts, or an article of manufacture), such as can include or use a pin driver control system comprising a first current source configured to provide a drive current signal, a first current switch configured to use the drive current signal to provide a switched output signal, the switched output signal having a non-zero high-side value and a non-zero low-side value, and a switch controller configured to provide control signals to the first current source and to the first current switch. In Aspect 10, the control signals can be based on (1) information about a desired bias current magnitude for a switching device in the first current switch, (2) information about a desired magnitude difference between the high-side and low-side values of the switched output signal, and (3) a timing signal configured to control switching of the switched output signal between the high-side and low-side values.

Aspect 11 can include or use, or can optionally be combined with the subject matter of Aspect 10, to optionally include the switch controller configured to provide first control signals to the first current source using the information about the desired bias current magnitude for a switching device in the first current switch and the information about the desired magnitude difference between the high-side and low-side values of the switched output signal.

Aspect 12 can include or use, or can optionally be combined with the subject matter of Aspect 11, to optionally include the switch controller configured to provide second control signals to the first current switch using the information about the desired bias current magnitude for a switching device in the first current switch and the timing signal configured to control switching of the switched output signal between the high-side and low-side values.

Aspect 13 can include or use, or can optionally be combined with the subject matter of Aspect 12, to optionally include the switch controller including a bias control circuit configured to control the first current source to provide the drive current signal with a magnitude that meets or exceeds a sum of the desired bias current magnitude and the desired magnitude difference between the high-side and low-side values of the switched output signal.

Aspect 14 can include or use, or can optionally be combined with the subject matter of Aspect 13, to optionally include the switch controller having a voltage control circuit configured to provide the second control signals as a differential voltage control signal, and the first current switch can include a first differential pair of transistors configured to receive the differential voltage control signal, and a first one of the transistors can be configured to provide the switched output signal.

Aspect 15 can include or use, or can optionally be combined with the subject matter of Aspect 14, to optionally include the first current source including a second differential pair of transistors that is matched to the first differential pair of transistors. In Aspect 15, the second differential pair can be configured to provide a control signal to a source device that provides the drive current signal. In Aspect 15, the voltage control circuit can include a third differential pair of transistors that is matched to the first differential pair of transistors, and voltage information from base terminals of the third differential pair can be used to provide the differential voltage control signal.

Aspect 16 can include or use subject matter (such as an apparatus, a system, a device, a method, a means for performing acts, or a device readable medium including instructions that, when performed by the device, can cause the device to perform acts, or an article of manufacture), such as can include or use a method for providing a switched test signal to a device under test (DUT) using a first current switch, the first current switch configured to use a drive current signal to provide the switched test signal with a non-zero high-side value and a non-zero low-side value. In Aspect 16, the method can include using a switch controller to receive information about a desired bias current magnitude for the first current switch, receive information about a desired magnitude difference between the high-side value and the low-side value of the switched test signal, and receive a timing signal configured to control switching of the switched test signal between the high-side value and the low-side value. In an example, in response to the various received information and signals, Aspect 16 can include generating a first control signal for controlling a first current source based on the received information about the desired bias current magnitude and the information about the desired magnitude difference between the high-side value and the low-side value of the switched test signal, and can include generating a second control signal for controlling the first current switch based on the received information about the desired bias current magnitude and the timing signal.

Aspect 17 can include or use, or can optionally be combined with the subject matter of Aspect 16, to optionally include receiving the first control signal at the first current source and, in response, providing the drive current signal to the first current switch. In an example, the drive current signal can have a magnitude that meets or exceeds a sum of the desired bias current magnitude (e.g., a magnitude of i_ClassA) and a magnitude of the difference between the high-side and low-side values of the switched test signal (e.g., a magnitude of i_Swing).

Aspect 18 can include or use, or can optionally be combined with the subject matter of Aspect 16 or Aspect 17, to optionally include generating the first control signal for controlling the first current source, including using a first differential pair of transistors that is matched to a second differential pair of transistors used to provide the switched test signal.

Aspect 19 can include or use, or can optionally be combined with the subject matter of Aspect 18, to optionally include generating the second control signal for controlling the first current switch, such as using a third differential pair of transistors that is matched to the first differential pair of transistors.

Aspect 20 can include or use, or can optionally be combined with the subject matter of Aspect 16 to optionally include the first current switch comprising a first differential pair of transistors, and the switch controller comprising a different second differential pair of transistors that is matched to the first differential pair. In Aspect 20, generating the second control signal for controlling the first current switch can include, using a buffer circuit, receiving information about respective base terminal voltages of the second differential pair and, in response, providing corresponding voltage signals at respective base terminals of the first differential pair.

Each of these non-limiting Aspects can stand on its own, or can be combined in various permutations or combinations with one or more of the other Aspects, examples, or features discussed elsewhere herein.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A pin driver control system comprising:
   a first current switch circuit including a current input node and a voltage input node, wherein the first current switch circuit is configured to provide a switched output current signal in response to a voltage control signal at the voltage input node;
   a first current source configured to receive a bias control signal and, in response, provide a drive current signal to the current input node of the first current switch, wherein the drive current signal has a magnitude that exceeds a magnitude of the switched output current signal; and
   a bias control circuit configured to receive information about a desired bias current magnitude for use by the first current switch circuit and, in response, provide the bias control signal to the first current source.

2. The pin driver control system of claim 1, further comprising a buffer circuit configured to monitor a control voltage from the bias control circuit and, in response, provide a corresponding voltage control signal at the voltage input node of the first current switch circuit.

3. The pin driver control system of claim 1, wherein the first current source comprises:
   a tail current control circuit configured to receive the bias control signal and information about a desired magnitude of the switched output current signal and, in response, provide a tail current control signal; and
   a tail current source device configured to provide the drive current signal in response to the tail current control signal.

4. The pin driver control system of claim 3, wherein the first current switch circuit and the tail current control circuit comprise respective matched instances of a differential pair of transistors.

5. The pin driver control system of claim 4, wherein the differential pair in the tail current control circuit comprises first and second transistors,
   wherein the tail current control circuit comprises a gain network configured to drive a first current signal through the first transistor, and
   wherein the first current signal and the switched output current signal have substantially the same magnitude.

6. The pin driver control system of claim 1, wherein the bias control circuit comprises a gain circuit configured to use the received information about the desired bias current magnitude to provide the bias control signal to a first transistor in the first current source.

7. The pin driver control system of claim 1, further comprising:
   a voltage control circuit configured to use the information about the desired bias current magnitude and a timing signal to provide the voltage control signal to the voltage input node of the first current switch circuit to thereby control the switched output current signal.

8. The pin driver control system of claim 7, wherein the first current switch circuit, the first current source, and the voltage control circuit comprise respective matched instances of a differential pair of transistors, and wherein the voltage control circuit is configured to provide the voltage control signal as a differential voltage signal at the voltage input node, and the voltage input node comprises base terminals of the differential pair of the first current switch circuit.

9. The pin driver control system of claim 1, wherein the first current switch circuit is configured to provide the switched output current signal as a digital signal having a low-side magnitude corresponding to the desired bias current magnitude and having a high-side magnitude corresponding to a sum of the desired bias current magnitude and the desired magnitude of the switched output current signal.

10. A pin driver control system comprising:
    a first current source configured to provide a drive current signal;
    a first current switch configured to use the drive current signal to provide a switched output signal, the switched output signal having a non-zero high-side value and a non-zero low-side value; and
a switch controller configured to provide control signals to the first current source and to the first current switch, wherein the control signals are based on:
information about a desired bias current magnitude for a switching device in the first current switch;
information about a desired magnitude difference between the high-side and low-side values of the switched output signal; and
a timing signal configured to control switching of the switched output signal between the high-side and low-side values.

11. The pin driver control system of claim 10, wherein the switch controller is configured to provide first control signals to the first current source using the information about the desired bias current magnitude for a switching device in the first current switch and the information about the desired magnitude difference between the high-side and low-side values of the switched output signal.

12. The pin driver control system of claim 11, wherein the switch controller is configured to provide second control signals to the first current switch using the information about the desired bias current magnitude for a switching device in the first current switch and the timing signal configured to control switching of the switched output signal between the high-side and low-side values.

13. The pin driver control system of claim 12, wherein the switch controller comprises a bias control circuit configured to control the first current source to provide the drive current signal with a magnitude that meets or exceeds a sum of the desired bias current magnitude and the desired magnitude difference between the high-side and low-side values of the switched output signal.

14. The pin driver control system of claim 13, wherein the switch controller comprises a voltage control circuit configured to provide the second control signals as a differential voltage control signal;
wherein the first current switch comprises a first differential pair of transistors configured to receive the differential voltage control signal; and
wherein a first one of the transistors is configured to provide the switched output signal.

15. The pin driver control system of claim 14, wherein the first current source comprises a second differential pair of transistors that is matched to the first differential pair of transistors;
wherein the second differential pair is configured to provide a control signal to a source device that provides the drive current signal;
wherein the voltage control circuit comprises a third differential pair of transistors that is matched to the first differential pair of transistors; and
wherein voltage information from base terminals of the third differential pair is used to provide the differential voltage control signal.

16. A method for providing a switched test signal to a device under test (DUT) using a first current switch, the first current switch configured to use a drive current signal to provide the switched test signal with a non-zero high-side value and a non-zero low-side value, the method comprising:
at a switch controller:
receiving information about a desired bias current magnitude for the first current switch;
receiving information about a desired magnitude difference between the high-side value and the low-side value of the switched test signal;
receiving a timing signal configured to control switching of the switched test signal between the high-side value and the low-side value;
generating a first control signal for controlling a first current source based on the received information about the desired bias current magnitude and the information about the desired magnitude difference between the high-side value and the low-side value of the switched test signal; and
generating a second control signal for controlling the first current switch based on the received information about the desired bias current magnitude and the timing signal.

17. The method of claim 16, further comprising receiving the first control signal at the first current source and, in response, providing the drive current signal to the first current switch, wherein the drive current signal has a magnitude that meets or exceeds a sum of a magnitude of the desired bias current and a magnitude of the difference between the high-side and low-side values of the switched test signal.

18. The method of claim 16, wherein generating the first control signal for controlling the first current source comprises using a first differential pair of transistors that is matched to a second differential pair of transistors used to provide the switched test signal.

19. The method of claim 18, wherein generating the second control signal for controlling the first current switch comprises using a third differential pair of transistors that is matched to the first differential pair of transistors.

20. The method of claim 16, wherein the first current switch comprises a first differential pair of transistors, and wherein the switch controller comprises a different second differential pair of transistors that is matched to the first differential pair;
wherein generating the second control signal for controlling the first current switch comprises, using a buffer circuit, receiving information about respective base terminal voltages of the second differential pair and, in response, providing corresponding voltage signals at respective base terminals of the first differential pair.

* * * * *